United States Patent
Wagner

(10) Patent No.: US 7,145,386 B2
(45) Date of Patent: Dec. 5, 2006

(54) CONFIGURABLE INPUT AMPLIFIER FOR POSITION-MEASURING DEVICES

(75) Inventor: Johannes Wagner, Taching/Tengling (DE)

(73) Assignee: Dr. Johannes Heidenhain Gmbh, Traunreut (DE)

( * ) Notice: Subject to any disclaimer, the term of this patent is extended or adjusted under 35 U.S.C. 154(b) by 139 days.

(21) Appl. No.: 11/073,124

(22) Filed: Mar. 4, 2005

(65) Prior Publication Data

US 2005/0248400 A1 Nov. 10, 2005

(30) Foreign Application Priority Data

Mar. 5, 2004 (DE) .................. 10 2004 010 785

(51) Int. Cl.
*H03F 3/45* (2006.01)
(52) U.S. Cl. .................. 330/69; 330/124 R; 330/51; 330/295
(58) Field of Classification Search .................. 330/69, 330/124 R, 51, 295
See application file for complete search history.

(56) References Cited

U.S. PATENT DOCUMENTS

| | | | | |
|---|---|---|---|---|
| 5,444,417 A | * | 8/1995 | Botti et al. ................ | 330/51 |
| 5,708,390 A | * | 1/1998 | Dunnebacke ................ | 330/51 |
| 5,729,174 A | * | 3/1998 | Dunnebacke et al. ......... | 330/51 |
| 5,789,974 A | * | 8/1998 | Ferguson et al. ............ | 330/2 |
| 6,590,448 B1 | * | 7/2003 | Burt ........................ | 330/124 R |
| 6,741,483 B1 | * | 5/2004 | Stanley ..................... | 363/65 |

* cited by examiner

*Primary Examiner*—Patricia Nguyen
(74) *Attorney, Agent, or Firm*—Kenyon & Kenyon LLP

(57) ABSTRACT

A configurable input amplifier for position-measuring devices includes at least one amplifier unit, which has a first input and a second input, as well as a first output and a second output, and may be operated in at least two different configurations. In a first configuration, a first operational amplifier is arranged between the first input and the first output and a second operational amplifier is arranged between the second input and the second output, the first and second operational amplifiers being connected as signal amplifiers. Therefore, output signals, which are proportional to the input signals applied to the inputs, are available at the outputs. In a second configuration, the first operational amplifier is connected as a differential amplifier. In this manner, an output signal proportional to the difference of the input signals applied to the inputs is available at the output.

13 Claims, 3 Drawing Sheets

CONFIGURABLE INPUT AMPLIFIER FOR POSITION-MEASURING DEVICES

FIELD OF THE INVENTION

The present invention relates to a configurable input amplifier for position-measuring devices. A configurable input amplifier allows a circuit for analyzing position signals in position-measuring devices to be designed such that it may be used in different position-measuring devices without modification. This may be particularly advantageous, when this circuit is integrated into an application-specific chip (ASIC).

BACKGROUND INFORMATION

Position-measuring devices are widespread and are particularly used in machine tools for acquiring path information or angular information. These are often incremental position-measuring devices. To determine the relative position of two objects moving with respect to each other, they normally include an incremental scale graduation mark on the sides of a rule. This mark is scanned with the aid of a scanning unit, in order to generate incremental signals. Different scanning principles, e.g., optical or magnetic, are employed for this purpose.

On the basis of the scanning principle, the path information or angular information acquired by the scanning unit are usually provided in the form of sinusoidal current signals. Several position signals are often generated, which are out of phase with each other. If, for example, two position signals are present which are out of phase with each other by 90°, the direction of movement can be determined from the information as to which signal is leading or lagging. In the case of signals that are 180° out of phase, the susceptibility to interference may be reduced by generating a differential signal, since interference present on both signals is eliminated by subtraction. When a direct-current component is contained in the sinusoidal current signals, it is also compensated for by subtraction.

The following signal combinations are conventional:
- four sinusoidal current signals, each having a 90° phase shift (0°; 90°; 180°, 270°), without a direct-current component
- four sinusoidal current signals, each having a 90° phase shift (0°; 90°; 180°, 270°), with a direct-current component
- three sinusoidal current signals, each having a 90° phase shift (0°; 90°; 180), with a direct-current component
- three sinusoidal current signals, each having a 120° phase shift (0°; 120°; 240°), with a direct-current component Therefore, depending on the application case, there is a different number of sinusoidal current signals available, having different phase angles with respect to each other, the current signals being transmitted to a signal-processing device for analysis. There, the current signals are often initially converted to voltage signals in an input amplifier. In the case of signals that are 180° out of phase, a differential-voltage signal, which is proportional to the input signals, is often already formed in the input amplifier from the signals that are 180° out of phase. During the subsequent signal processing in the sequential electronics, inter alia, errors are corrected, and the period of the sinusoidal signals is subdivided by interpolation, and in this manner, the resolution of the position signals is increased. The position signals are subsequently converted into standardized formats and outputted.

In the course of progressive miniaturization, as well as for reasons of economic efficiency, it is becoming more and more common to integrate the electronic circuits, which are needed by incremental position-measuring devices to analyze the position signals, into application-specific chips (ASIC's). However, up to this point, the above-described plurality of measuring principles and the resulting type and number of signals to analyzed has made it necessary to develop a separate ASIC for each family of incremental position-measuring devices.

Disadvantages result from this: the cost of ASIC's only renders them economically interesting in large quantities, and their development and the associated product service is time-intensive and cost-intensive. Thus, there is a permanent need to design the electronic circuits for analyzing the position signals of incremental position-measuring devices that they may be used for several different applications. Therefore, when the electronic circuit is integrated into an ASIC, higher quantities are obtained, thereby increasing the economic efficiency and reducing the development expenditure.

For the sequential electronics for carrying out the above-described signal processing by error correction, interpolation, and conversion into standardized data formats, the same circuits may often already be used for several applications, when the input signals are appropriately processed in an input amplifier. Thus, the electronic circuits for analyzing position signals only differ in that the input amplifier is present.

SUMMARY

An example embodiment of the present invention may provide a configurable input amplifier for position-measuring devices, which may be operated in different configurations and may thus process several types of input signals such that the same sequential electronics may be used for analyzing them.

Provided is a configurable input amplifier for position-measuring devices, which includes at least one amplifier unit, which has a first input and a second input, as well as a first output and a second output, and may be operated in at least two different configurations. In a first configuration, a first operational amplifier is arranged between the first input and the first output and a second operational amplifier is positioned between the second input and the second output, the first and second operational amplifiers being connected as signal amplifiers. Therefore, output signals, which are proportional to the input signals applied to the inputs, are available at the outputs. In a second configuration, the first operational amplifier is connected as a differential amplifier. In this manner, an output signal, which is proportional to the difference of the input signals applied to the inputs, is available at the output.

According to an example embodiment of the present invention, a configurable input amplifier for a position-measuring device includes at least one amplifier unit including a first input, a second input, a first output and a second output, the at least one amplifier unit operable in at least two different configurations. In a first configuration, a first operational amplifier arranged between the first input and the first output and a second operational amplifier arranged between the second input and the second output are connected as signal amplifiers, output signals available at the first output and the second output being proportional to input signals applied to the first input and the second input. In a second configuration, the first operational amplifier is connected as a differential amplifier, an output signal available at the first output being proportional to a difference of the input signals applied to the first input and the second input.

The first input may be connected to an inverting input of the first operational amplifier. A non-inverting input of the first operational amplifier is connectible to a reference voltage via a first switching element, and the first output is connected to an output of the first operational amplifier and coupled back to the inverting input of the first operational amplifier via a first impedor. The second input is connectible to the non-inverting input of the first operational amplifier via a second switching element and connectible to an inverting input of the second operational amplifier via a first additional switching element and connected to a first terminal of a second impedor. A second terminal of the second impedor is connectible to the reference voltage via a third switching element and connectible to an output of the second operational amplifier via a second additional switching element. The non-inverting input of the second operational amplifier is connected to the reference voltage, and the second output is connected to the output of the second operational amplifier.

The at least one amplifier unit may include a first amplifier unit, a second amplifier unit and an averaging voltage divider configured to generate an average-value signal from the output signals of the first output and the second output of the first amplifier unit. In a third configuration, the first amplifier unit is connected according to the first configuration, the average-value signal linked to a non-inverting input of the first operational amplifier of the second amplifier unit, the first operational amplifier of the second amplifier unit connected as a non-inverting amplifier, an output signal proportional to the average-value signal available at the first output of the second amplifier unit, the second operational amplifier of the second amplifier unit connected as a signal amplifier arranged between the second input and the second output of the second amplifier unit, an output signal proportional to the input signal applied to the second input of the second amplifier unit available at the second output of the second amplifier unit.

The averaging voltage divider may include a third impedor, a fourth impedor, a fifth impedor and a switching element. The first output of the first amplifier unit and the second output of the first amplifier unit are respectively connected to a first terminal of the fifth impedor via the third impedor and the fourth impedor. A second terminal of the fifth impedor is connected to the reference voltage, an impedance of the third impedor and the fourth impedor are equal, and an average-value signal generated at a common nodal point of the third, fourth, and fifth impedors are linkable to the non-inverting input of the first operational amplifier of the second amplifier unit via a switching element.

The configurable input amplifier may include a switching device configured to set a state of the switching elements as a function of the configuration.

The input signals applied to the first input and the second input may be approximately sinusoidal.

The switching elements may be arranged as semiconductor switches.

The impedors may be arranged as complex resistors including an ohmic resistor and a capacitor connected in parallel.

The configuration may be selectable via a digital interface, which may be arranged as a serial interface.

The operational amplifiers that do not have a function in one of the configurations may be adapted to be switched to an inactive state via a control signal.

A defined signal may be outputted at the output of an operational amplifier switched to an inactive state.

According to an example embodiment of the present invention, a position-measuring device includes a configurable input amplifier as described above.

Further aspects and details hereof are described in the following description of an example embodiment of a configurable input amplifier with reference to the appended Figures.

DETAILED DESCRIPTION

Figure 1:
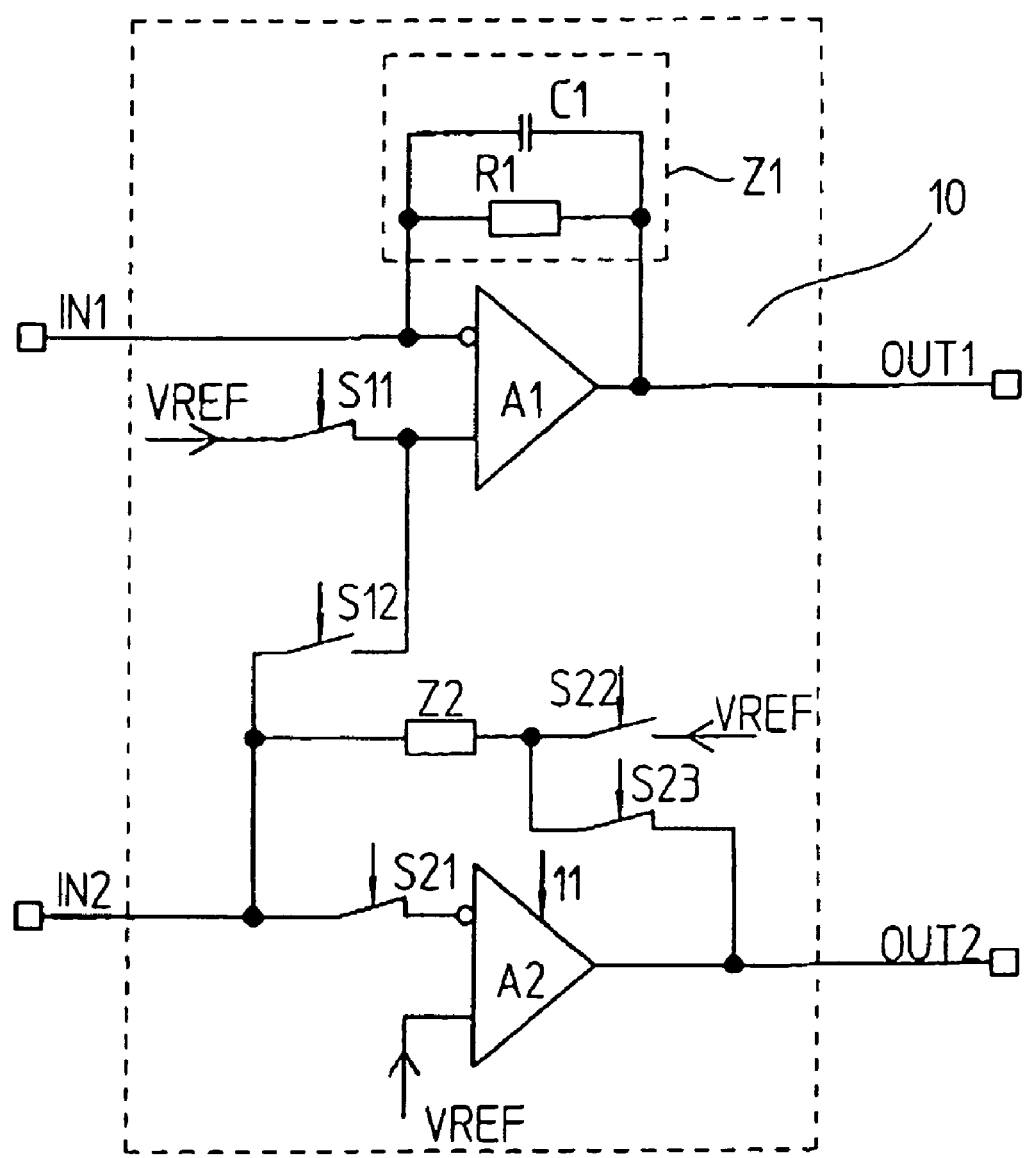
FIG. 1 is a schematic circuit diagram of an example embodiment of a configurable input amplifier.

FIG. 1 is a schematic circuit diagram of an example embodiment of a configurable input amplifier for use in position-measuring devices. It includes an amplifier unit 10, which has a first input IN1, a second input IN2, a first output OUT1, and a second output OUT2.

First input IN1 is connected to the inverting input of a first operational amplifier A1. First output OUT1 is connected to the output of first operational amplifier A1 and is coupled back to the inverting input of first operational amplifier A1 via a first impedance Z1. The non-inverting input of first operational amplifier A1 is connectible to a reference voltage VREF via a switching element S11.

Second input IN2 of amplifier unit 10 is connectible to the non-inverting input of first operational amplifier A1 via a switching element S12, and is connectible to the inverting input of a second operational amplifier A2 via a switching element S21. In addition, the second input of the operational amplifier is connected to a first terminal of a second impedor Z2. The second terminal of second impedor Z2 is connectible to reference voltage VREF via a switching element S22, and is connectible to the output is connectible to the output of second operational amplifier A2 via a switching element S23. Second output OUT2 of amplifier unit 10 is connected to the output of second operational amplifier A2. Reference voltage VREF is applied to the non-inverting input of second operational amplifier A2.

In a first configuration K1, switching elements S11, S21, S23 are closed and switching elements S12 and S22 are open. Consequently, operational amplifiers A1 and A2 function as two current-controlled, voltage sources, which are separated from each other. That is, current signals, which are applied to inputs IN1 and IN2, are converted to proportional voltage signals. Reference voltage VREF is used as a reference point for output signals OUT1 and OUT2.

In a second configuration K2, switching elements S11, S21, and S23 are open and switching elements S12 and S22 are closed. In this manner, second input IN2 of amplifier unit 10 is connected to the non-inverting input of first operational amplifier A1 via switching element S12, and is connected to reference voltage VREF via second impedor Z2 and switching element S22. Since switching element S21 is open, second operational amplifier A2 has no function. A voltage signal, which is proportional to the difference of the current signals applied to inputs IN1 and IN2, is output at first output OUT1 of amplifier unit 10.

As previously mentioned above, the input signals to be processed are mostly approximately sinusoidal and have different phase angles with respect to each other. If two sinusoidal signals 180° out of phase are injected into inputs IN1 and IN2, the following features are obtained for the voltage signal at output OUT1:

1. So-called common-mode interference, i.e., interference contained equally in the two current signals at inputs IN1 and IN2, is compensated for by subtraction.
2. The direct-current component contained in the sinusoidal current signals is eliminated, i.e., the voltage signal at output OUT1 is approximately offset-free.

The switch positions of switching elements S11, S12, S21, S22, S23 for configurations K1 and K2 are summarized in the following table:

| Switching Element | First Configuration K1 | Second Configuration K2 |
| --- | --- | --- |
| S11 | closed | open |
| S12 | open | closed |
| S21 | closed | open |
| S22 | open | closed |
| S23 | closed | open |

Figure 2:
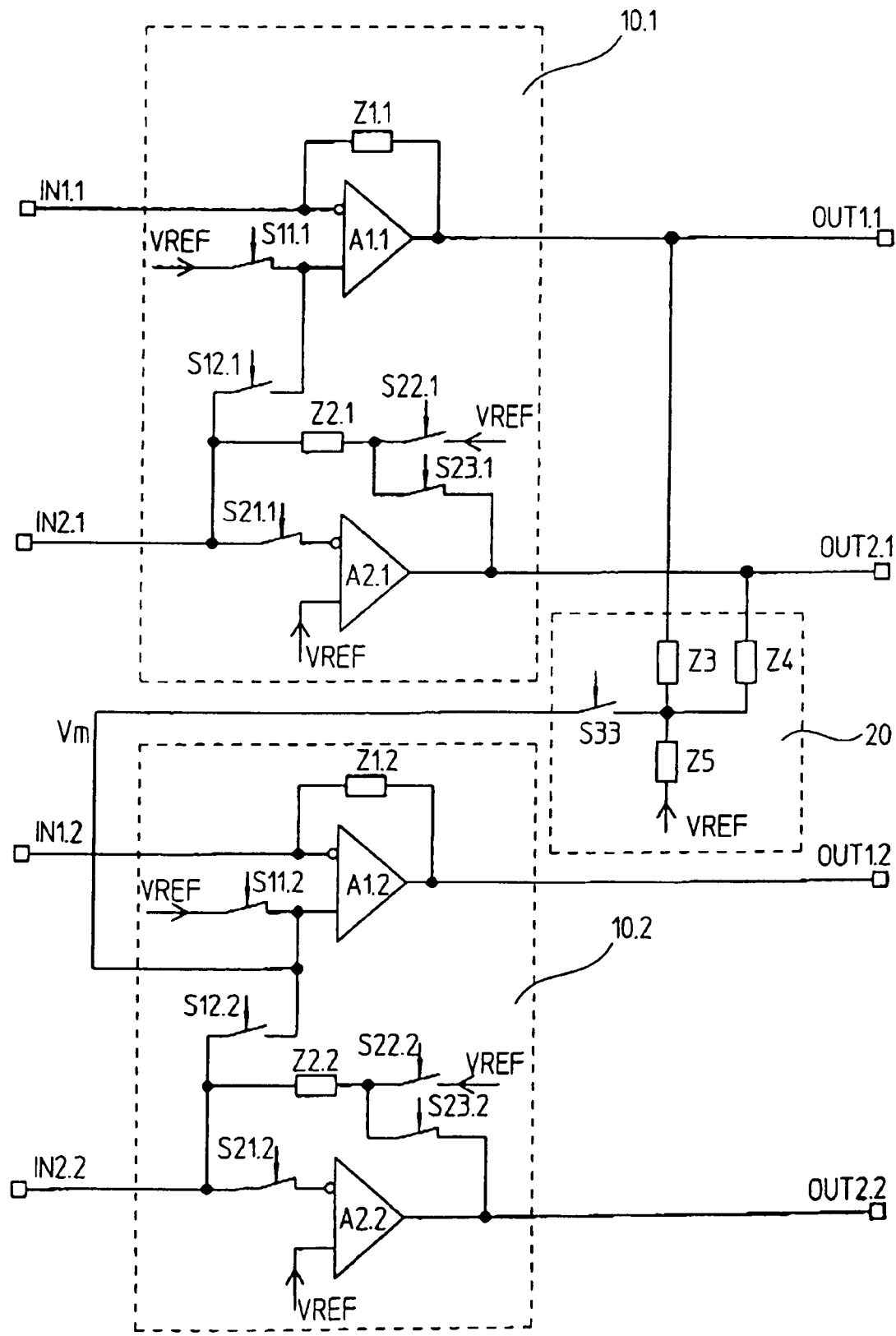
FIG. 2 is a schematic circuit diagram of an example embodiment of a configurable input amplifier.

FIG. 2 is schematic circuit diagram of an example embodiment of a configurable input amplifier for use in position-measuring devices. The input amplifier includes two amplifier units 10.1, 10.2 having the same arrangement as amplifier unit 10 illustrated in FIG. 1. For purposes of differentiation, the serial number of the amplifier unit is added to the reference numerals of amplifier units 10.1, 10.2. Thus, the first amplifier unit illustrated in FIG. 2 is referred to as 10.1, and the second amplifier unit is referred to as 10.2. In an analogous manner, Z1.1 in first amplifier unit 10.1 corresponds to first impedor Z1 in FIG. 1, and Z1.2 in second amplifier unit 10.2 corresponds to first impedor Z1, etc.

In addition, an averaging voltage divider 20 which includes a third impedor Z3, a fourth impedor Z4, and a fifth impedor Z5 is connected in outgoing circuit to outputs OUT1.1 and OUT2.1 of amplifier unit 10.1.

First output OUT1.1 and second output OUT2.1 are connected to the first terminal of fifth impedor Z5 via third impedor Z3 and fourth impedor Z4, respectively. The second terminal of fifth impedor Z5 is connected to reference voltage VREF. When the condition Z3=Z4 is observed, an average-value signal Vm sets in at the common nodal point of impedors Z3, Z4, Z5, the average-value signal being switchable to the non-inverting input of first operational amplifier A1.2 of amplifier unit 10.2 via a switching element S33.

Therefore, in addition to first configuration K1 and second configuration K2 of the configurable input amplifier illustrated in FIG. 1, a third configuration K3 is also possible in the example embodiment illustrated in FIG. 2.

In amplifier unit 10.1, switching elements S11.1, S21.1, S23.1 are closed and switching elements S12.1, S22.1 are open, and in amplifier unit 10.2, switching elements S21.2, S23.2 are closed and switching elements S11.2, S12.2, S22.2 are open. In addition, switching element S33 in averaging voltage divider 20 is closed.

Therefore, in third configuration K3 of the configurable input amplifier, the two operational amplifiers A1 and A2 of amplifier unit 10.1 function as current-controlled voltage sources in accordance with above-described, first configuration K1. An average-value signal Vm, which arrives at the non-inverting input of first operational amplifier A1.2 of amplifier unit 10.2 via switching element S33, is generated in averaging voltage divider 20 from output signals OUT1.1 and OUT2.1 of the amplifier unit. When input IN1.2 of amplifier unit 10.2 is open-circuited, operational amplifier A1.2 functions as a non-inverting amplifier having an amplification factor of 1, i.e., it functions as a so-called unity-gain amplifier. This means that average-value signal Vm is only buffered and outputted to output OUT1.2 at an unchanged amplitude. It should be appreciated that the amplification factor of operational amplifier A1.2 may be varied in wide ranges by externally connecting input IN1.2.

Operational amplifier A2.2 of second amplifier unit 10.2 functions as a current-controlled voltage source in accordance with first configuration K1.

For clarity, the switch positions of switching elements S11.1, S12.1, S21.1, S22.1, S23.1, S11.2, S12.2, S21.2, S22.2, S23.2, S33 for configurations K1, K2, K3 are summarized in the following table:

| Switching Element | First Configuration K1 | Second Configuration K2 | Third Configuration K3 |
| --- | --- | --- | --- |
| S11.1 | closed | open | closed |
| S12.1 | open | closed | open |
| S21.1 | closed | open | closed |
| S22.1 | open | closed | open |
| S23.1 | closed | open | closed |
| S11.2 | closed | open | open |
| S12.2 | open | closed | open |
| S21.2 | closed | open | closed |
| S22.2 | open | closed | open |
| S23.2 | closed | open | closed |
| S33 | open | open | closed |

Semiconductor switches are used as switching elements S11, S12, S21, S22, S23, S11.1, S12.1, S21.1, S22.1, S23.1, S11.2, S12.2, S21.2, S22.2, S23.2, S33. These may be switched on and off with almost no power and are well-suited for integration in an application-specific chip (ASIC).

Utilized impedors Z1, Z2, Z3, Z4, Z5, Z1.1, Z2.1, Z1.2, Z2.2 may include ohmic resistors and capacitive and/or inductive reactances. As indicated by Z1 in FIG. 1, they may include an ohmic resistor R1, to which a capacitor C1 is connected in parallel. In this example, first operational amplifier A1 functions as a low-pass filter having a cut-off frequency of $fg=1/(2*\Pi*R1*C1)$. This means that high-frequency interference contained in the input signal may be reduced.

Depending on configuration K1, K2, K3, in which amplifier units 10, 10.1, 10.2 are operated, one of operational amplifiers A1, A2, A1.1, A2.1, A1.2, A2.2 may not be needed for the functioning of the circuit. It may be provided that corresponding operational amplifier A1, A2, A1.1, A2.1, A1.2, A2.2 may be switched to be inactive. This may reduce the power consumption and, thus, the heating of the circuit, as well.

In the inactive state, a specific voltage level, e.g., VREF, may be output at corresponding output OUT1, OUT2, OUT1.1, OUT2.1, OUT1.2, OUT2.2. This may prevent any indefinite behavior of operational amplifier A1, A2, A1.1, A2.1, A1.2, A2.2, which may result from the open-circuited, inverting input.

For purposes of illustration, the option of switching second operational amplifier A2 to be inactive is indicated in FIG. 1 by a control signal 11. If the circuit is operated in second described configuration K2, then second operational amplifier A2 does not have a function. In this case, it may be switched to inactive via control signal 11.

The circuits illustrated in FIG. 1 and FIG. 2 are arranged so that current signals applied to inputs IN1, IN2, IN1.1, IN2.1, IN1.2, IN2.2 are converted into voltage signals proportional to them and outputted at outputs OUT1, OUT2, OUT1.1, OUT2.1, OUT1.2, OUT2.2. Such circuits are referred to as current-controlled, voltage sources. However, the use of additional impedors connected in series to inputs IN1, IN2, IN1.1, IN2.1, IN1.2, IN2.2 may also allow the circuits to be used for processing voltage signals. In this case, one speaks of voltage-controlled voltage sources. The additional impedors may also be integrated into the ASIC.

Figure 3:
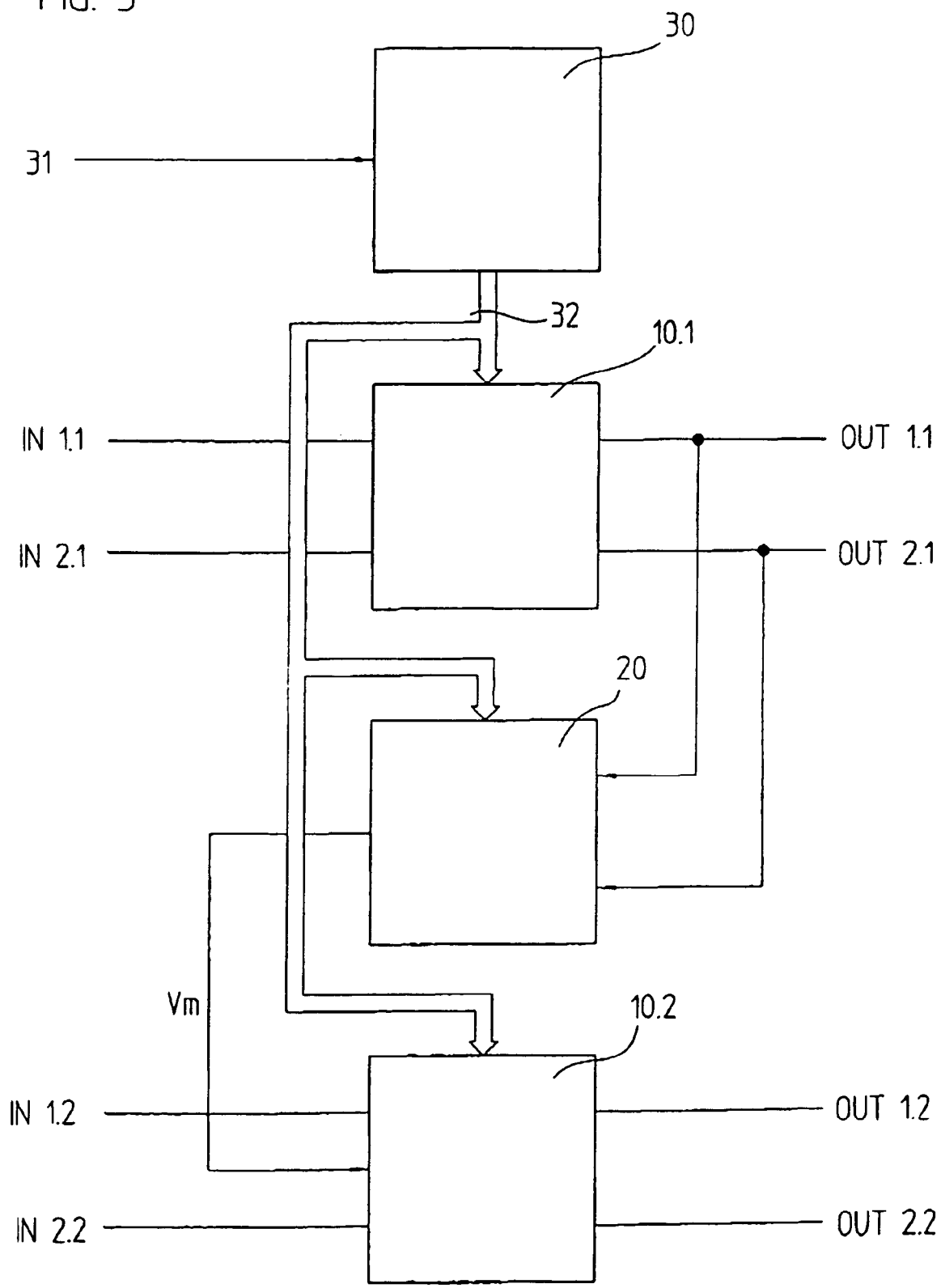
FIG. 3 is a block diagram of a configurable input amplifier having a master control unit.

FIG. 3 is a block diagram of a configurable input amplifier, including two amplifier units 10.1, 10.2 and an averaging voltage divider 20, along with a master control unit 30, by which the configuration in which the input amplifier is operated may be selected.

The information regarding the configuration, in which the input amplifier should be operated, is obtained by control unit 30 via at least one configuration line 31. Switching elements S11, S12, S21, S22, S23, S11.1, S12.1, S21.1, S22.1, S23.1, S11.2, S12.2, S21.2, S22.2, S23.2, S33 are open or closed via a plurality of switching lines 32, as a function of selected configuration K1, K2, K3.

Therefore, control unit 30, configuration line 31, and switching lines 32 represent switching devices 30, 31, 32, via which the state of the switching elements S11, S12, S21, S22, S23, S11.1, S12.1, S21.1, S22.1, S23.1, S11.2, S12.2, S21.2, S22.2, S23.2, S33 is determined according to configuration K1, K2, K3.

The at least one configuration line 31 may be selection lines, where the electric potential by which they are connected determines the configuration K1, K2, K3 that is selected. The at least one configuration line 31 may be a digital interface 31, e.g., a serial interface. A digital interface 31 may already be present in application-specific chips, which are used in position-measuring devices. Therefore, no additional lines may be necessary. In addition, this type of control may be very flexible. Thus, e.g., without a high degree of complexity, it may be provided that each individual switching element be able to be specifically switched on and off. In this manner, e.g., test functions or additional configurations may be integrated.

It should be appreciated that the described example embodiments of a configurable input amplifier may be modified and adapted to many different requirements.

What is claimed is:

1. A configurable input amplifier for a position-measuring device, comprising:
at least one amplifier unit including a first input, a second input, a first output and a second output, the at least one amplifier unit operable in at least two different configurations;
wherein, in a first configuration, a first operational amplifier arranged between the first input and the first output and a second operational amplifier arranged between the second input and the second output are connected as signal amplifiers, output signals available at the first output and the second output being proportional to input signals applied to the first input and the second input; and
wherein, in a second configuration, the first operational amplifier is connected as a differential amplifier, an output signal available at the first output being proportional to a difference of the input signals applied to the first input and the second input.

2. The configurable input amplifier according to claim 1, wherein the first input is connected to an inverting input of the first operational amplifier, a non-inverting input of the first operational amplifier connectible to a reference voltage via a first switching element, the first output connected to an output of the first operational amplifier and coupled back to the inverting input of the first operational amplifier via a first impedor, the second input connectible to the non-inverting input of the first operational amplifier via a second switching element and connectible to an inverting input of the second operational amplifier via a first additional switching element and connected to a first terminal of a second impedor, a second terminal of the second impedor connectible to the reference voltage via a third switching element and connectible to an output of the second operational amplifier via a second additional switching element, the non-inverting input of the second operational amplifier connected to the reference voltage, the second output connected to the output of the second operational amplifier.

3. The configurable input amplifier according to claim 1, wherein the at least one amplifier unit includes a first amplifier unit, a second amplifier unit and an averaging voltage divider, the averaging voltage divider configured to generate an average-value signal from the output signals of the first output and the second output of the first amplifier unit;
wherein, in a third configuration, the first amplifier unit is connected according to the first configuration, the average-value signal linked to a non-inverting input of the first operational amplifier of the second amplifier unit, the first operational amplifier of the second amplifier unit connected as a non-inverting amplifier, an output signal proportional to the average-value signal available at the first output of the second amplifier unit, the second operational amplifier of the second amplifier unit connected as a signal amplifier arranged between the second input and the second output of the second amplifier unit, an output signal proportional to the input signal applied to the second input of the second amplifier unit available at the second output of the second amplifier unit.

4. The configurable input amplifier according to claim 3, wherein the averaging voltage divider includes a third impedor, a fourth impedor, a fifth impedor and a switching element, the first output of the first amplifier unit and the second output of the first amplifier unit respectively connected to a first terminal of the fifth impedor via the third impedor and the fourth impedor, a second terminal of the fifth impedor connected to the reference voltage, an impedance of the third impedor and the fourth impedor being equal, an average-value signal generated at a common nodal point of the third, fourth, and fifth impedors being linkable to the non-inverting input of the first operational amplifier of the second amplifier unit via a switching element.

5. The configurable input amplifier according to claim 2, further comprising a switching device configured to set a state of the switching elements as a function of the configuration.

6. The configurable input amplifier according to claim 1, wherein the input signals applied to the first input and the second input are approximately sinusoidal.

7. The configurable input amplifier according to claim 2, wherein the switching elements are arranged as semiconductor switches.

8. The configurable input amplifier according to claim 2, wherein the impedors are arranged as complex resistors including an ohmic resistor and a capacitor connected in parallel.

9. The configurable input amplifier according to claim 1, wherein the configuration is selectable via a digital interface.

10. The configurable input amplifier according to claim 9, wherein the digital interface is arranged as a serial interface.

11. The configurable input amplifier according to claim 1, wherein the operational amplifiers that do not have a function in one of the configurations are adapted to be switched to an inactive state via a control signal.

12. The configurable input amplifier according to claim 11, wherein a defined signal is outputted at the output of an operational amplifier switched to an inactive state.

13. A position-measuring device, comprising:
a configurable input amplifier including:
  at least one amplifier unit including a first input, a second input, a first output and a second output, the at least one amplifier unit operable in at least two different configurations;
  wherein, in a first configuration, a first operational amplifier arranged between the first input and the first output and a second operational amplifier arranged between the second input and the second output are connected as signal amplifiers, output signals available at the first output and the second output being proportional to input signals applied to the first input and the second input; and
  wherein, in a second configuration, the first operational amplifier is connected as a differential amplifier, an output signal available at the first output being proportional to a difference of the input signals applied to the first input and the second input.

* * * * *